US006705877B1

(12) United States Patent
Li et al.

(10) Patent No.: US 6,705,877 B1
(45) Date of Patent: *Mar. 16, 2004

(54) STACKABLE MEMORY MODULE WITH VARIABLE BANDWIDTH

(75) Inventors: Che-yu Li, Ithaca, NY (US); Sharon Laura Moriarty, Mountain View, CA (US); Zhineng Fan, Santa Clara, CA (US)

(73) Assignee: High Connection Density, Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/345,450

(22) Filed: Jan. 17, 2003

(51) Int. Cl.⁷ ................................................. H01R 9/09
(52) U.S. Cl. ............................ 439/74; 356/52; 257/686
(58) Field of Search ........................... 439/74, 66, 331, 439/70, 71, 91, 591; 257/686, 777; 365/52, 51, 63, 56, 148, 145

(56) References Cited

U.S. PATENT DOCUMENTS

| | | | |
|---|---|---|---|
| 6,172,895 B1 | 1/2001 | Brown et al. | 365/63 |
| 6,264,476 B1 | 7/2001 | Li et al. | 439/66 |
| 6,540,525 B1 | 4/2003 | Li et al. | 439/66 |
| 6,545,895 B1 | 4/2003 | Li et al. | 365/52 |

OTHER PUBLICATIONS

U.S. patent application Ser. No. 09/932,654.
U.S. patent application Ser. No. 10/077,057, Moriarty et al.

*Primary Examiner*—Ross Gushi
*Assistant Examiner*—Phuongchi Nguyen
(74) *Attorney, Agent, or Firm*—Salzman & Levy

(57) ABSTRACT

The present invention is a family of memory modules. In one embodiment a memory module with granularity and upgradeability of bandwidth, and a low profile uses 256 MB SDRAM or DDR SDRAM memory devices in chip scale packages (CSPs) to support a memory data bus width of up to at least 512 bits. Each module includes an impedance-controlled substrate having contact pads, memory devices, and other components on its surfaces. In one embodiment, the inclusion of spaced apart multiple area array interconnections allows a row of memory devices to be symmetrically mounted on each side of each of the area array interconnections, thereby reducing the interconnect lengths and facilitating matching of interconnect lengths. Short area array interconnections, including ball grid array (BGA) and land grid array (LGA) options, provide electrical communication between modules and the rest of the system. Thermal control structures may be included to maintain reliable operating temperatures.

38 Claims, 7 Drawing Sheets

STACKABLE MEMORY MODULE WITH VARIABLE BANDWIDTH

RELATED PATENT APPLICATIONS

This application is related to U.S. Pat. No. 6,264,476, issued to Li et al. for WIRE SEGMENT BASED INTERPOSER FOR HIGH FREQUENCY ELECTRICAL CONNECTION, to U.S. Pat. No. 6,172,895, issued to Brown et al. for HIGH CAPACITY MEMORY MODULE WITH BUILT-IN HIGH SPEED BUS TERMINATIONS, to copending U.S. patent application Ser. Nos. 09/932,525, filed Aug. 17, 2001; 09/932,654, filed Aug. 17, 2001; 10/077,057, filed Feb. 19, 2002; and 10/127,036, filed Apr. 22, 2002, all of which are hereby incorporated by reference.

FIELD OF THE INVENTION

The present invention relates to high input/output (I/O), high density, low cost electronic modules and, more particularly, to the high I/O, high density, high capacity, low cost packaging of high performance, high capacity memory devices such as Double Data Rate (DDR) Synchronous Dynamic Random Access Memory (SDRAM) and having impedance-controlled buses for maintaining high electrical performance.

BACKGROUND OF THE INVENTION

In data processing and network systems, it is always a certainty that the demand in memory throughput will increase at a high rate. In recent years such increase has taken on a new dimension. While the demand for memory throughput has increased, the area available for mounted memory devices, the high quantities of I/O they require, and the height available has become increasingly restricted.

The Electronic Industries Association (EIA) has set up a standard for the dimensions for rack-mountable equipment. Traditionally, a piece of rack-mountable equipment has a standard width of 19 inches and a height in increments of 1.75 inches. This is also known as "1U". However, a trend has begun to reduce the height for the servers in a server rack to dimensions appreciably lower than 1U.

This equipment height restriction has also placed height restrictions on other components such as memory modules. The traditional SDRAM dual inline memory modules (DIMMs) are simply too high to be able to be mounted vertically on the system board. Special sockets have been designed to allow DIMMs to be mounted either at an angle or even parallel to the system board.

One way to increase memory throughput is to increase the operating frequency of the memory devices. But this also requires the memory modules and connectors to support the higher speeds, which is becoming increasingly difficult to implement. Another way to increase memory throughput is to increase the bandwidth of the memory channel.

A 256-bit memory channel has four times the throughput of a 64-bit channel when operated at the same frequency. A higher throughput is important in many industries that run real-time applications (e.g., gaming, video graphics, speech processing, and networking applications). Increasing throughput through widening the bus is often much easier to implement and less expensive than methods such as doubling the clock frequency of the memory subsystem, reducing latency in bus cycles, and implementing complex multi-symbol modulation schemes or pulse code modulation (PCM) type approaches.

Increasing the throughput through widening the memory channel requires a significant increase in the quantity of I/O connections to support these memory devices while still trying to minimize the area used. This precludes the use of edge-interconnected memory modules such as traditional memory module form factors such as DIMMs and RAM-BUS® Inline Memory Modules (RIMMs) and forces one to explore the use of area array interconnections. In some applications the interconnection is permanent (i.e., soldered) through a technique known as ball grid array (BGA) attachment, while others are field separable through pin grid array (PGA) and land grid array connectors.

BGA interconnections are viable for a quantity of up to approximately 1000 I/O. The mechanical reliability of larger BGA arrays is a concern due to the larger distance from neutral point (DNP) of the array, which is caused by coefficient of thermal expansion (CTE) mismatches. Moreover, manufacturability due to the nonplanarity of mating surfaces is also a concern.

PGA connectors are viable for field separable applications requiring a quantity of up to about 500 I/O. The mechanical reliability of larger surface mount PGA arrays is also a concern due to the larger distance from DNP of the array, which is caused by CTE mismatches.

For field separable applications requiring greater than 500 I/O, and grid array (LGA) connectors, and in particular LGA connectors as taught in some of the referenced copending U.S. patent applications, provide improved performance, increased density, lower height, and a CTE that better matches that of the surrounding structures.

One method being used today to solve the need to increase both memory capacity and density is to stack two, thin small outline package (TSOP) SDRAM devices on top of each other on a DIMM. An alternate approach is to stack two devices within a chip scale package (CSP). These stacking schemes, while increasing memory density, are not easily reworkable.

It is desirable to find a packaging solution that resolves the memory throughput capacity and density, interconnection quantity and density, and the height issues. In addition, the solution must also be low in cost, readily manufacturable, upgradeable with ample granularity, have improved electrical performance even at high frequencies, and have good reliability. Ample granularity allows the throughput on a given memory module to be increased or decreased as required (e.g., in increments of 16 bits, instead of 64 bits).

It is therefore an object of the invention to provide a variable bandwidth, high density, low profile SDRAM memory module for high performance memory devices.

It is another object of the invention to provide a variable bandwidth, high density, low profile SDRAM memory module that is readily manufacturable and upgradeable.

It is still another object of the invention to provide a variable bandwidth, high density, low profile SDRAM memory module that provides improved electrical performance at high frequencies and good reliability.

SUMMARY OF THE INVENTION

The present invention relates to a family of specialized embodiments of the modules taught in the referenced copending U.S. patent applications. A memory module is desired with granularity and upgradeability of bandwidth, and a low profile using 256 MB SDRAM or DDR SDRAM memory devices in CSPs to support a memory data bus width of up to at least 512 bits.

Each module includes a substrate, having contact pads and memory devices on its surfaces, and impedance-controlled transmission line signal paths. The substrates may be conventional printed circuit cards preferably with CSP packaged memory devices along with other components attached directly to both sides of the substrates.

The inclusion of spaced, multiple area array interconnections allows a row of memory devices to be symmetrically mounted on each side of each of the area array interconnections, thereby reducing the interconnect lengths and facilitating matching of interconnect lengths. The footprints for the interconnections between the substrates and to the system board are the same to reduce part number and reliability and qualification testing. Short area array interconnections, including BGA and LGA options provide interconnections between modules and the rest of the system. The distance between the spaced multiple area array interconnections is preferably chosen to ensure that the solder joints in the BGA interconnection option are reliable.

Driver line terminators may be included on the substrates for maintaining high electrical performance. Thermal control structures may also be included to maintain the memory devices within a reliable range of operating temperatures.

BRIEF DESCRIPTION OF THE DRAWINGS

A complete understanding of the present invention may be obtained by reference to the accompanying drawings, when taken in conjunction with the detailed description thereof and in which:

FIG. 1b is an enlarged, side elevational view of a vertical plated-through-hole attach connector and memory card of the prior art interconnection shown in FIG. 1a;

FIG. 2b is a cross-sectional view of a multi-card configuration based on the memory module of FIG. 2a;

FIG. 4b is a cross-sectional view of a multi-card configuration based on the memory module of FIG. 4a.

DETAILED DESCRIPTION OF THE PREFERRED EMBODIMENT

Generally speaking, the present invention relates to a family of specialized embodiments of the modules taught in the referenced copending U.S. patent applications. A memory module is desired with granularity and upgradeability of bandwidth, and a low profile using 256 MB SDRAM or DDR SDRAM memory devices in CSPs to support a memory data bus width of up to at least 512 bits.

Each module includes a substrate, having contact pads and memory devices on its surfaces, and impedance-controlled transmission line signal paths to support high-speed operation. The substrates may be conventional printed circuit cards preferably with CSP packaged memory devices along with other components attached directly to both sides of the substrates.

The inclusion of spaced, multiple area array interconnections allows a row of memory devices to be symmetrically mounted on each side of each of the area array interconnections, thereby reducing the interconnect lengths and facilitating matching of interconnect lengths. The footprints for the interconnections between the substrates and to the system board are the same to reduce part number and reliability and qualification testing. Short area array interconnections, including BGA and LGA options, provide interconnections between modules and the rest of the system. The distance between the spaced multiple area array interconnections is preferably chosen to ensure that the solder joints in the BGA interconnection option are reliable.

Figure 1A:
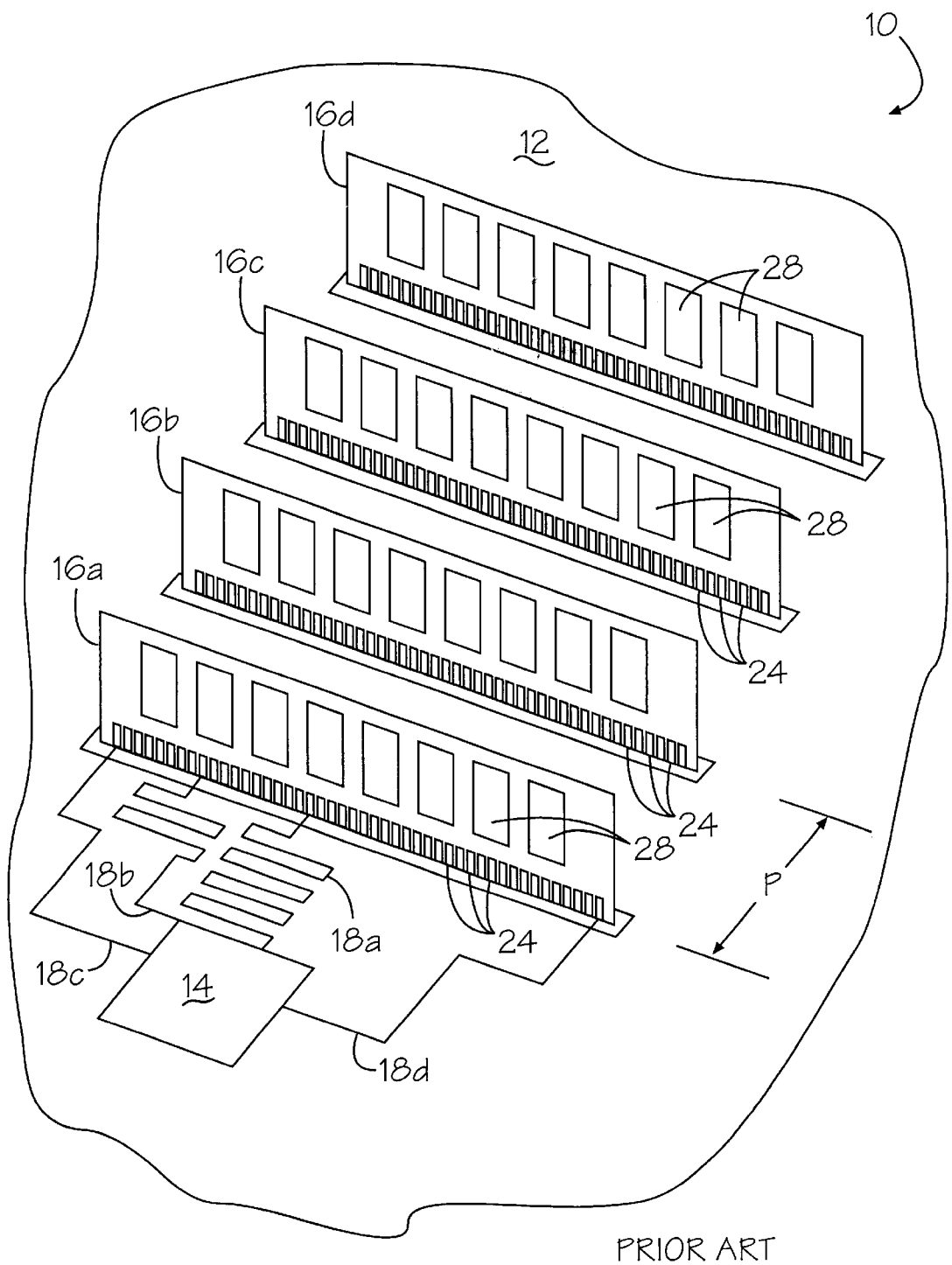
FIG. 1a is a representation of the bussed interconnection between a memory controller device and a multi-card memory arrangement of a memory subsystem of the prior art.

Referring first to FIG. 1a, there is shown a representation of a portion of a memory subsystem 10 of the prior art located on a system board 12, including a memory controller 14 and a multi-card memory arrangement with bussed interconnection therebetween. In this embodiment, memory subsystem 10 is based on DDR SDRAM technology, although many other technologies would also be applicable. Memory controller 14 is electrically connected to memory modules 16a–16d, each comprising a plurality of memory devices 28, through a plurality of bussed interconnections 18a–18d. In order to provide even higher density, memory devices 28 may be located on both sides (FIG. 1b) of memory modules 16a–16d and even stacked upon each other on either one or both sides; however, this type of stacking is costly, unreliable, and difficult to rework. It is also very difficult to cool such stacked devices.

Figure 1B:
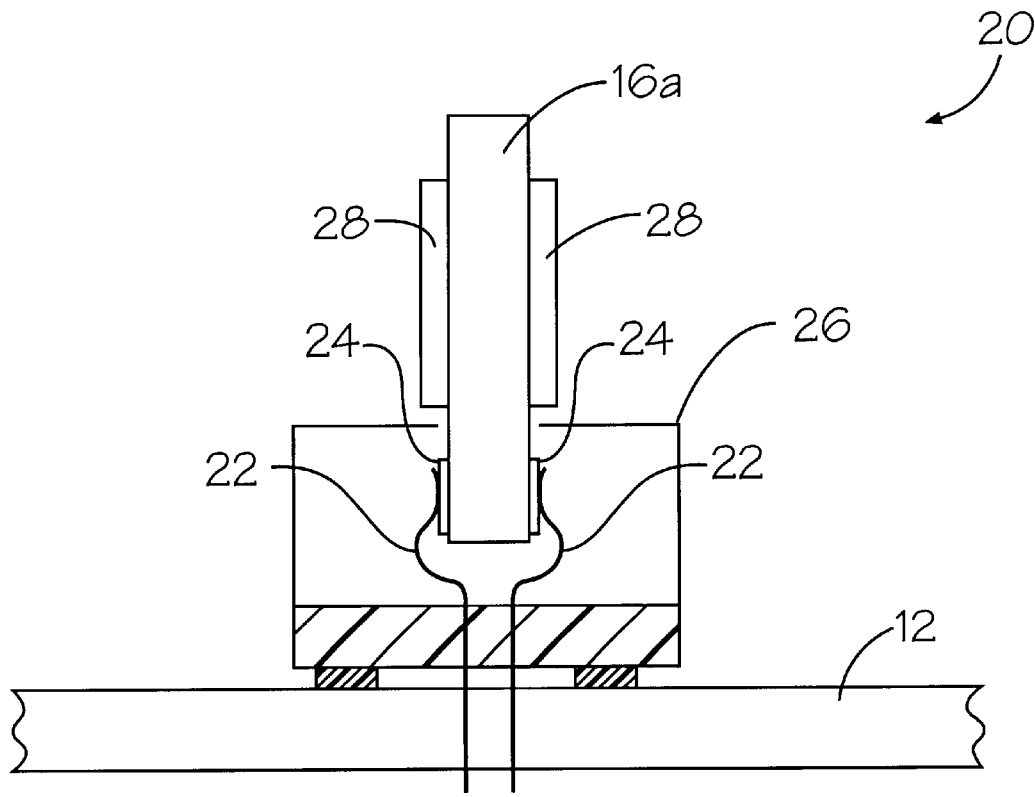

Memory controller 14 connects to system board 12 through an array of BGA solder interconnections (not shown) located on the bottom surface of memory controller 14. Memory modules 16a–16d are approximately 5.25 inches long and 1.38 inches tall, with the top edge about 1.50 inches above the surface of the system board 12, and with a distance between them, "P", of 0.5 inch. Modules 16a–16d include an array of contact pads 24 along their lower edge. Contact pads 24 provide electrical connection to system board 12 through an edge connector, which is not shown for purposes of clarity. A more detailed cross-sectional view of a single connector 20 comprising mating contacts 22 and housing 26, and corresponding memory module 16a is shown in FIG. 1b.

Memory modules 16a–16d typically are printed circuit structures comprising epoxy-glss-based materials (i.e., FR4) and including one or more conductive (i.e., signal, power and/or ground) layers therein. Due to stringent electrical specifications, the impedance of the signal traces must match the impedance of the corresponding traces on system board 12 within ten percent.

Assuming that each memory module 16a–16d has 512 megabytes of memory (a quantity that is available today), the volumetric area required for the four modules 16a–16d is 5.25 inches by 1.80 inches by 1.50 inches, or about 13.90 cubic inches, and about 9.45 square inches of area on system board 12. Also, while the height of memory modules 16a–16d just fit in a 1U high enclosure, it is unlikely that these memory modules 16a–16d will fit vertically in sub-1U high enclosures.

As stated hereinabove, edge-interconnected memory modules such as modules 16a–16d are precluded from use in wider memory channel applications due to the limited quantity of I/O connections 24 available to support the memory devices 28.

Figure 2A:
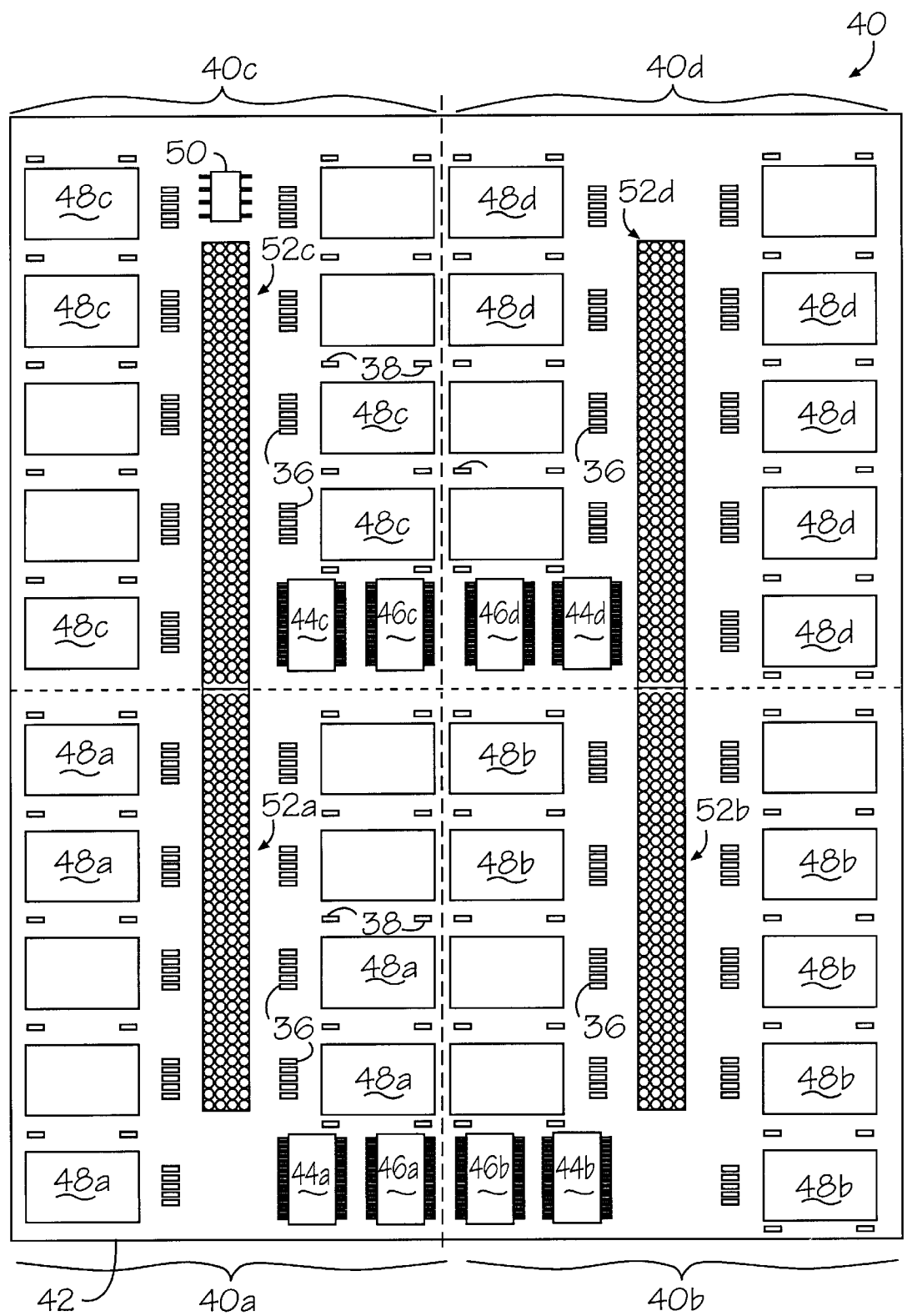
FIG. 2a is an enlarged top view of a memory module in accordance with one embodiment of the present invention.
Figure 2B:
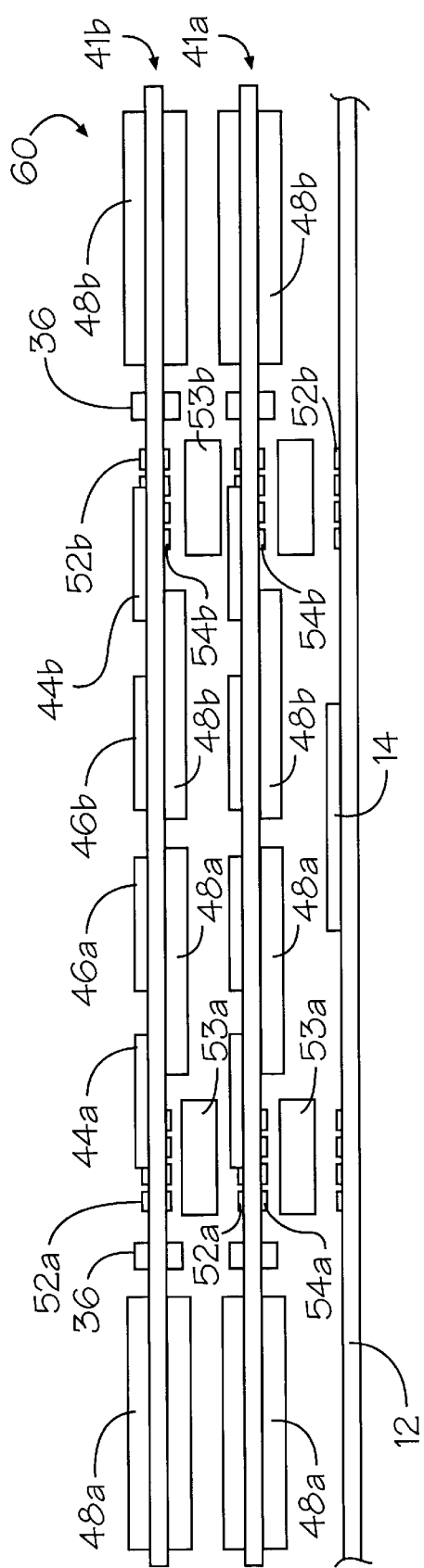

Referring now to FIGS. 2a and 2b, there are shown a top view of a memory module 40 in accordance with one embodiment of the present invention, and a cross-sectional view of a multi-card configuration 60 based on the memory module 40 of FIG. 2a, respectively.

In the embodiment of FIG. 2a, memory module 40 includes a substrate 42, a plurality of memory devices 48a–48d, phase lock loops (PLLs) 44a–44d, registers 46a–46d, a configuration memory device 50, resistors 36, capacitors 38, and upper contact pad arrays 52a–52d. Lower contact pad arrays 54a–54d and, optionally, additional memory. devices 48a–48d are located on the opposite side (FIG. 2b) of substrate 42.

In this embodiment, memory devices 48a–48d are 256 MB SDRAM or DDR SDRAM memory devices in CSPs, although other packages, such as bare chip, TSOP, and chip on board (COB) may be used. The preferred use of packaged devices 48a–48d eliminates the issues associated with known good die (KGD). Although 256 MB devices are the largest devices available today, it should be understood that memory device capacity is certain to increase in the future, and the use of higher as well as lower capacity memory devices is well within the scope of this invention.

Examples of substrate 42 suitable for interconnection include printed circuit boards, circuit modules, etc. The term "printed circuit board" is meant to include but not be limited to a multilayered circuit structure including one or more conductive (i.e., signal, power and/or ground) layers therein. Such printed circuit boards, also known as printed wiring boards, are well known in the art and further description is not believed necessary. The term "circuit module" is meant to include a substrate or like member having various electrical components (e.g., semiconductor chips, conductive circuitry, etc.), which may form part thereof. Such modules are also well known in the art and further description is not believed necessary.

Substrate 42 may comprise a wide variety of dielectric materials. In one example it is made of epoxy-glass-based materials typically used in printed circuit board fabrication (e.g., FR4) and also includes one or more conductive layers therein. Due to stringent electrical specifications, the signal traces typically match the system impedance within a certain tolerance (e.g., ten percent). These materials are preferred because their CTE substantially matches the CTE of the surrounding structures, especially for applications including LGA connectors, and because of their relatively low cost. Other possible materials include polyimide and RO2800 (a trademark of Rogers Corporation). It should be understood by those skilled in the art that other materials may also be used without departing from the spirit of the invention.

PLLs 44a–44d are used to control and synchronize the timing against a known system clock for memory devices 48a–48d. Registers 46a–46d are used to buffer and latch the state of the address and control buses against a known system clock. Configuration memory device 50 is used to store configuration information about the module 40 for use by the system. In this embodiment device 50 is an electrically erasable programmable read-only memory (EEPROM) device. Resistors 36 may be placed in series in the various electrical nets to dampen reflections. Capacitors 38 are strategically located, especially near memory devices 48a–48d, and function as decoupling capacitors. Both resistors 36 and capacitors 38 are implemented as surface mount devices in this embodiment but may be implemented in other form factors such as embedded components.

A significant contribution to the advantages of the present invention is derived from the locations of the footprint of upper contact pad arrays 52a–52d and mating lower contact pad arrays 54a–54d (FIG. 2b), which are interconnected by area array interconnections 53a–53d (FIG. 2b). The specific implementation of area array interconnections 53a–53d for interconnecting contact pad arrays 52a–52d and mating pad arrays 54a–54d is design dependent and may vary depending on a specific set of requirements. In one example, if lowest cost and height are most desirable, the BGA option may be preferred. In another example, the LGA option is demountable and is therefore useful for applications requiring field upgradeability. The LGA option may require an alignment and clamping mechanism. Implementations of these items are covered in one of the referenced copending U.S. patent applications.

The separated contact pad arrays 52a–52d on the top surface and 54a–54d on the bottom surface allow a row of memory devices 48a–48d to be symmetrically mounted on each side of each respective contact pad cluster, which provides the shortest possible electrical path from the memory devices 48a–48d to system board 12 (FIG. 2b) and facilitates the matching of interconnect length. From a mechanical point of view, the distance between the contact pad arrays 52a–52d and 54d–54d is chosen to be wide enough to support the required quantity of memory devices 48a–48d, but narrow enough to ensure that the solder joints in the BGA interconnection option are reliable.

Component positioning on memory module 40 provides another benefit over the prior art. Components are positioned on memory module 40 to allow the module 40 to support multiple (four, in this case) channels 40a–40d of memory. This capability allows a single memory module 40, with memory devices 48a–48d on both sides (assuming memory devices 48a–48d each have a capacity of 256 MB) to support up to 2 GB of 64-bit wide memory (512 MB per channel), with a granularity of 256 MB per channel, or 512 MB of 256-bit wide memory.

Depending on how contact pad arrays 54a–54d are wired on the system board 12 (FIG. 2b), the memory devices 48a–48d may be configured to operate in either a single channel or as multiple independent channels. In one example, this option allows the operation of four 64-bit memory channels (40a–40d) or a single 256-bit memory channel. A 256-bit memory channel has four times the throughput of a 64-bit channel when operated at the same frequency. A higher throughput is important in many industries required to run real-time applications (e.g., gaming, video graphics, speech processing, and networking applications). Increasing throughput through widening the bus is often much easier to implement and less expensive compared to methods such as doubling the clock frequency of the memory subsystem, reducing latency in bus cycles, implementing complex multi-symbol modulation schemes or pulse code modulation (PCM) type approaches.

Using the memory devices 48a–48d on memory channels 40a–40d as shown in this embodiment, module 40 can support a single memory channel with a bus width of 256 bits. It should be understood that while a 256-bit memory channel is used for purposes of disclosure, the contact pad arrays 52a–52d and 54a–54d and area array interconnections 53a–53d used support a memory bus width of at least 512 bits.

For applications requiring less memory bus width, fewer memory channels 40a–40d can be populated and therefore implemented. For this type of application, since fewer area array interconnections 53a–53d (FIG. 2b) are needed but mechanical stability of the overall memory module 40 is desired, to reduce costs the unused interconnection locations may be selectively depopulated or replaced by spacers of similar dimensions as area array interconnections 53a–53d. For applications requiring less memory, half of the full quantity of memory devices 48a–48d on a given channel 40a–40d can be populated.

Figure 2C:
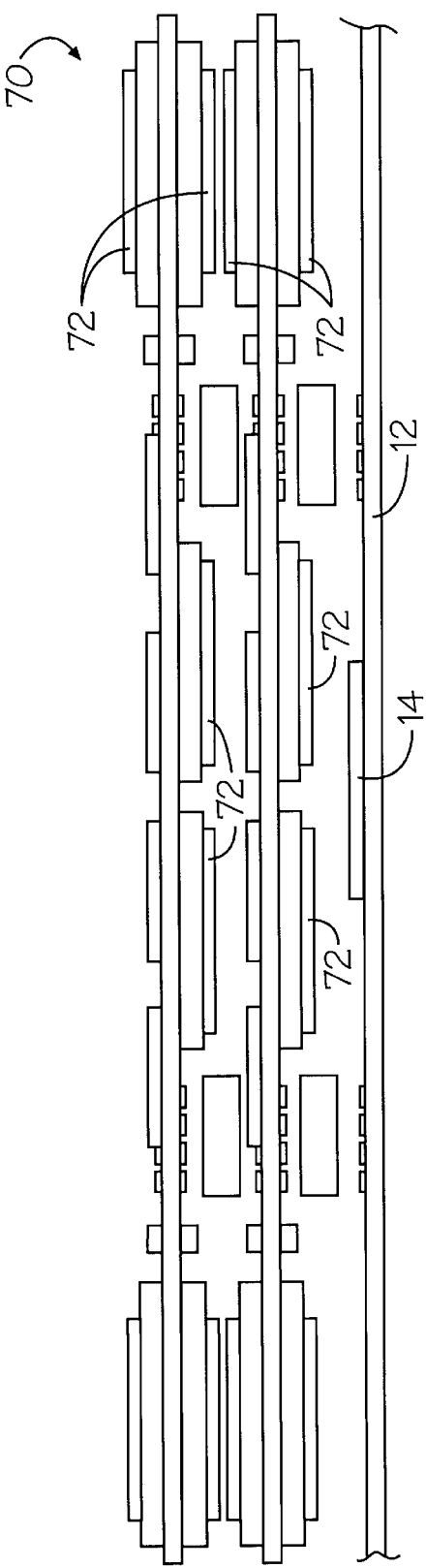
FIG. 2c is a cross-sectional view of the multi-card configuration in accordance with an extension of the embodiment of FIG. 2b.

System electrical performance can be further enhanced by including additional functionality, such as termination components to the module 40, without significantly increasing the cost and size of the module 40. This is taught in one of the referenced copending U.S. patent applications. Also, heatspreaders or equivalent thermal conduction devices 72 may be placed in contact with memory devices 48a–48d to provide improved thermal management if required. This is shown in FIG. 2c.

Another example of additional functionality is the inclusion of decoders (not shown) that may be used to perform functions such as generating extra chip selects for referencing additional memory channels on module 40.

A third example of additional functionality is the inclusion of field programmable components (not shown), which may be used to perform functions such as changing the values of the termination components. The field programmable components may include a field programmable gate array (FPGA), whose outputs control solid state switches to switch in resistive, capacitive or inductive blocks to establish a termination scheme that provides optimized performance. Some connections on the FPGA may be dedicated to a standard PC bus interface such as I2C, to make the terminations soft programmable.

A field programmable component may alternatively be employed to switch the module operation type from DDR to SDR, for example. Field programmable switches may also be used to deactivate the inverting net of all differential clocks that are not used in SDR operation, as well as to switch in extra components as needed. Other components that may be added include clock synthesizers, skew control blocks, FIFOs, and thermal shutdown or thermal monitoring integrated circuits, which may be installed at strategic hot points on module 40. A thermal shutdown device may be used to disable a power supply until conditions improve. This improves the reliability of memory devices 48a–48d on module 40.

Compared to the prior art memory modules 16a–16d of memory subsystem 10 (FIG. 1a), the inventive memory modules 40 offer improved signal integrity, due to the fact that the modules 40 have a reduced stub effect. Each electrical net in the prior art memory modules 16a–16d has a stub length up to 1.5 inches long. A stub is any net connecting parallel to the net, or controlled transmission line, of interest. It may include components. Unterminated stubs often are the result of used connectivity pathways for one or more components that are not populated in a given assembly, and can result in composite reflections that are twice the level of the initial signal. A stub degrades performance due to factors such as the timing relationships of the reflections exiting the stub, how that compares with the propagation delays to the other components on the bus, and the length of duration of the bus cycle. In short the design performance degradation associated with stubs tends to worsen with increasing frequency, longer stub lengths, more stubs, and greater spacing between stubs.

It should be understood by those skilled in the art that the various components of the invention may consist of alternate materials, instead of or in addition to the particular ones described in the disclosed embodiments, without departing from the spirit of the invention.

Referring now again to FIG. 2b, there is shown a cross-sectional view of a multi-card configuration 60 based on the memory module 40 of FIG. 2a. In one example of this embodiment, multi-card configuration 60, which includes two memory modules 41a and 41b, has a capacity of four gigabytes of 64-bit memory, or one gigabyte of 256-bit memory in a volume of just 4.54 inches by 5.66 inches by 0.36 inch, or about 9.25 cubic inches using BGA-based interconnections 53a–53d. In another example using field separable LGA-based area array interconnections 53a–53d as taught in some of the referenced copending U.S. patent applications, multi-card configuration 60, which again includes two memory modules 41a and 41b, has a capacity of four gigabytes of 64-bit memory, or one gigabyte of 256-bit memory in a volume of just 4.54 inches by 5.66 inches by 0.29 inch, or about 7.45 cubic inches.

The additional amount of system board 12 real estate required for printed circuit traces to wire memory controller 14 to memory modules 16a–16d in FIG. 1a is significantly greater than for wiring memory controller 14 to memory modules 41a and 41b of multi-card configuration 60 in the present invention, for additional system board 12 real estate savings.

Lower contact pad arrays 54a–54d on the lower module 41a are provided to allow electrical interconnection to a memory controller 14 on system board 12 through area array interconnections 53a–53d. Upper contact pad arrays 52a–52d on the lower module 41a mate with lower contact pad arrays 54a–54d on the upper module 41b through area array interconnections 53a–53d to extend the address and control buses from the memory controller 14. Upper contact pad arrays 52a–52d on the upper module 41b provides for the stacking of additional memory modules 40 (FIG. 2a) in the future. Maintaining uniform footprints for the interconnection between memory modules as well as to system board 12 reduces the proliferation of different memory module 40 (FIG. 2a) part numbers, and minimizes reliability and qualification testing. The substrates 42 are designed so that the modules 41a and 41b are positionally independent within the stack. In other words, the lower module 41a and upper module 41b may be interchanged within multi-card configuration 60 and still function properly.

The positioning of memory devices 48a–48d on stackable modules 41a and 41b relative to memory controller 14 provides several improvements compared to the prior art of FIG. 1a. This is taught in one of the referenced copending U.S. patent applications. The improvements include: reduced propagation delays and hence potentially higher operating frequencies; reduced settling times and periods for the ringing cycle established and associated with impedance mismatches between the bus and termination in a given net, which can also reduce inter-symbol interference (ISI); potentially less intra-bus skew variation, which leads to better timing margins; and simplified and reduced system board 12 routing. Reducing the spacing between modules 41a and 41b compared to the prior art examples shown herein above provides a performance improvement since reflections off stubs will exist longer on the bus if the spacing between stubs is longer.

Referring now to FIG. 2c, there is shown a cross-sectional view of a multi-card configuration 70 in accordance with an extension of the embodiment of FIG. 2b, further including thermal management structures 72.

The natural cooling efficiency of a module 40 is low due to the lack of an effective thermal transfer medium from the die or package of memory devices 48a–48d to the air, and the lack of a short air channel in the direction of air flow (i.e., parallel to system board 12). The thermal problem is exacerbated by the relatively large size of today's memory devices 48a–48d and the proximity to other heat generating devices 48a–48d in such a dense module 40. The thermal management structures 72 of the inventive modules 40 are designed to optimize both thermal conduction and radiation, thus allowing maximum circuit density without heat buildup, which could degrade memory device 48a–48d performance and reliability.

Thermal management structures 72 are intended to sink heat away from memory devices 48a–48d. Such structures 72 may be stand alone elements (e.g., heatsinks) or they may provide a low resistance thermal path to another surface such as the outer enclosure of a device (e.g., a laptop computer), which may include thermally conductive material.

Thermal management structures 72 may be implemented in many ways. Structures 72 may be as simple as a layer of thermally conductive material, such as aluminum, attached or retained to memory devices 48a–48d by thermally enhanced compounds or clamps. Structures 72 may be more complex and include elements such as fins (not shown) to augment cooling. Other methods may include the use of conformal pouches of liquid thermal transfer material, thin heat pipes, and thermoelectric devices. Even other methods of solving thermal issues will be obvious to those skilled in the art.

System electrical performance can be further enhanced, and significant system board real estate can be saved, by including additional functionality through the inclusion of additional stacked modules. The much lower profile of memory modules 40 allows the stacking of these modules with additional functionality even in sub-1U high applications.

Figure 3:
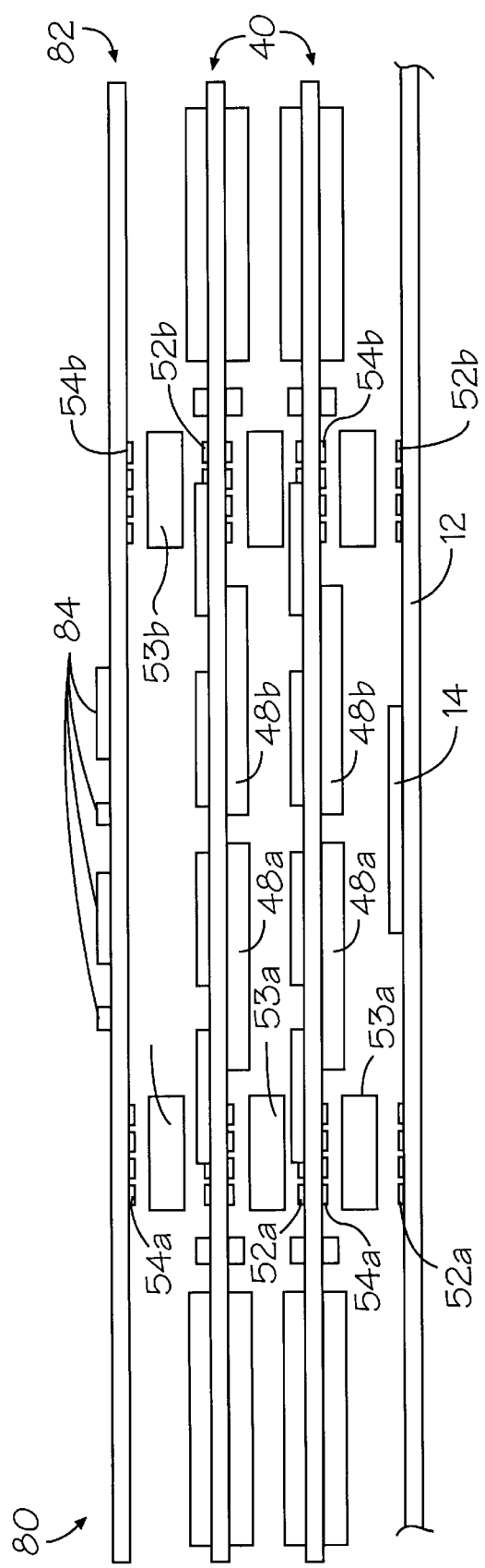
FIG. 3 is a cross-sectional view of the multi-card configuration of FIG. 2b including a termination module.

Referring now to FIG. 3, there is shown a cross-sectional view of a multi-card configuration 80 based on the memory module 40 of FIG. 2a. In this embodiment, multi-card configuration 80, which includes two memory modules 40, further includes a termination module 82. Termination module 82 comprises a plurality of components 84, which typically requires a large number of bulk capacitors, ferrite bead inductors, switching regulators, decoupling capacitors and termination components. The termination components may be passive components such as resistors and/or capacitors, but they may also include active filter-type components.

In another embodiment, it may be desirable to cluster the module interconnections. The concept of clustered area array connections also allows different quantities of modules containing a varied number of devices to share the same area array connection from module to module within the stack. Similarly, the same area array connection can be shared with a system board. These benefits are taught in one of the referenced copending U.S. patent applications.

For soldered interconnections such as BGA, column grid array (CGA), and surface mount soldered PGA connectors, clustering also provides improved mechanical reliability. This is due to reducing the distance from neutral point (DNP), which minimizes the mechanical reliability issues caused by coefficient of thermal expansion (CTE) mismatches. Moreover, manufacturability is improved, since non-planarity over a smaller area is less of a concern. These benefits apply to LGA connectors as well. The overall quantity of I/O and the area required also help to determine whether a particular interconnection technology is appropriate for use in a specific application.

Figure 4A:
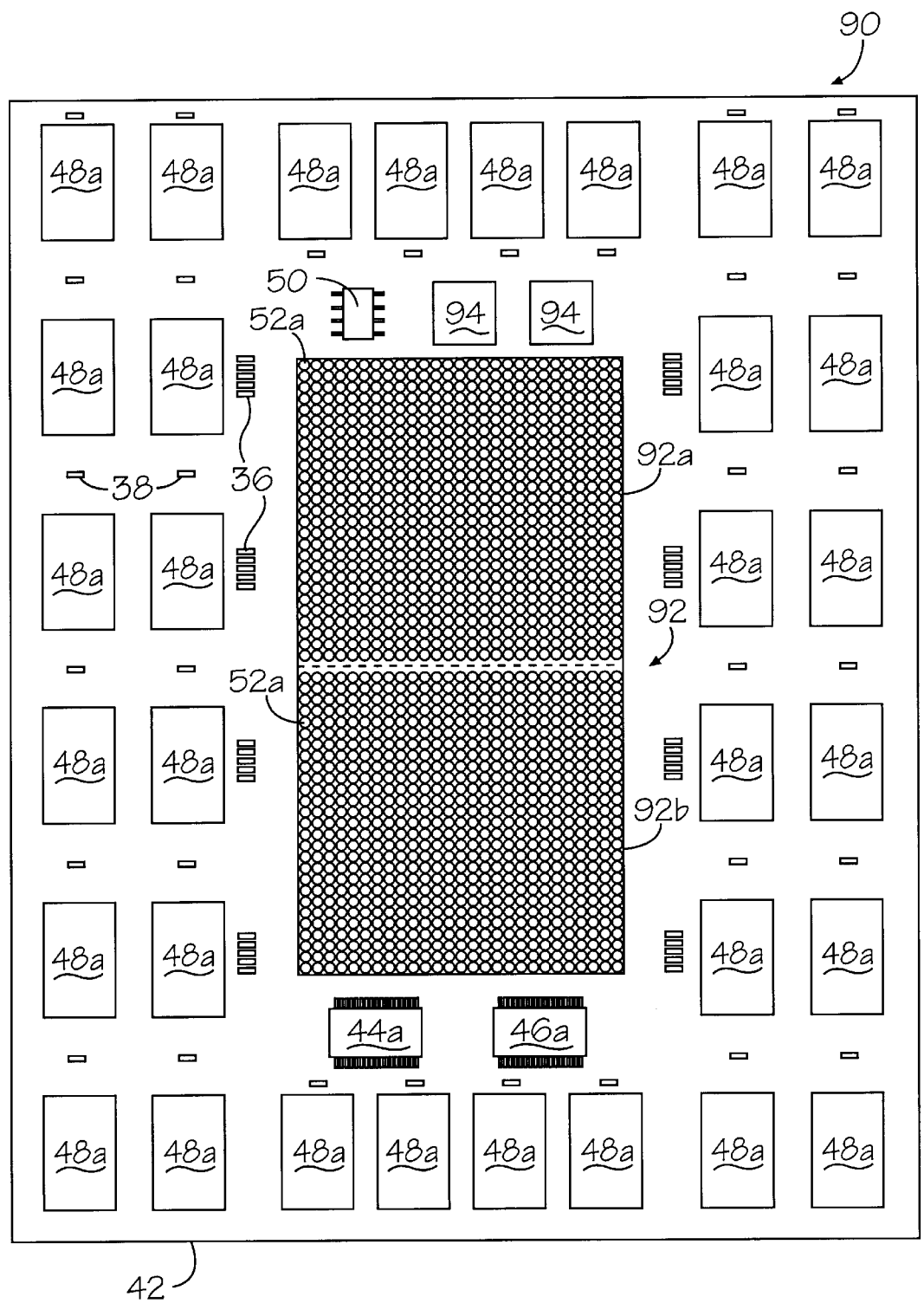
FIG. 4a is an enlarged top view of a memory module in accordance with another embodiment of the present invention.
Figure 4B:
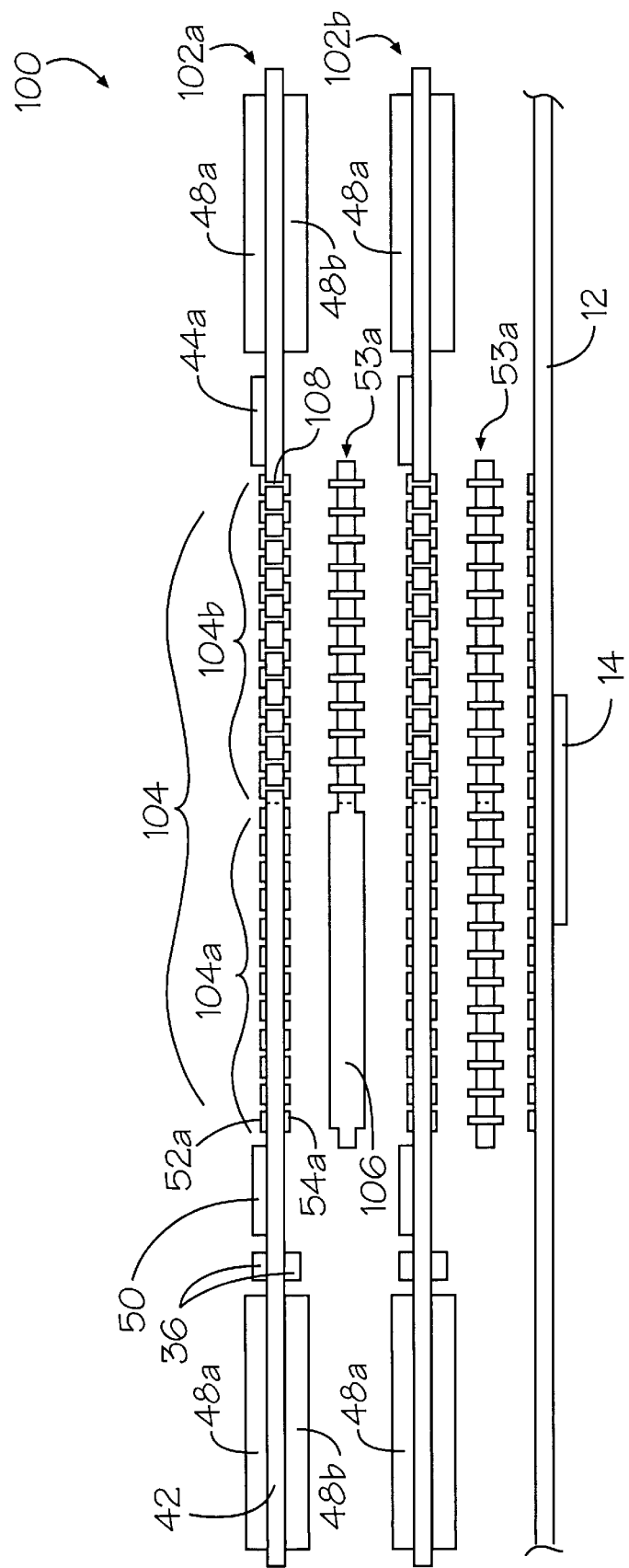

Referring now to FIG. 4a, there is shown a top view of a memory module 90 in accordance with another embodiment of the present invention. FIG. 4b depicts a cross-sectional view of a multi-card configuration 100 based on the memory module 90 of FIG. 4a.

In the embodiment of FIG. 4a, memory module 90 includes a substrate 42, a plurality of memory devices 48a, PLL 44a, register 46a, a configuration memory device 50, resistors 36, capacitors 38, and upper contact pad arrays 52a. Optionally and not shown in this drawing, a plurality of memory devices 48b, PLL 44b, register 46b, a configuration memory device 50, resistors 36, capacitors 38, and lower contact pad arrays 54a are located on the opposite side of substrate 42. The embodiment in FIG. 4b shows components on both sides of substrate 42.

Still referring to FIG. 4a, in this particular embodiment, memory module 90 has 32 memory devices 48a located on the top surface and 32 memory devices 48b on the bottom surface of substrate 42. Each memory device 48a–48b has a bus width of 8 bits, thereby allowing memory module 90 to have a memory data bus width of 256 bits per surface, or a total of 512 bits. Approximately 1200 I/O are required to support a 512-bit data bus and are shown in I/O area 92a. The memory devices 48a–48b on memory module 90 use only one half of total I/O area 92. Memory module 90 allows enough I/O to pass through I/O area 92b to support another 512-bit data bus on a second memory module (FIG. 4b) thereby providing an overall memory data bus 1024 bits wide. If desired, the granularity of the width of the data path can be limited to 256 bits by populating the memory devices 48a–48b on only one side of the memory module 90.

Memory module 90 may be implemented with other types of memory devices 48a–48b, such as RAMBUS devices, which may require high-speed impedance matching.

One or more additional devices 94 may be added to module 90 to increase the overall functionality. For example, devices 94 may be implemented as a plurality of low-cost microprocessors.

Referring now again to FIG. 4b, there is shown a cross-sectional view of a multi-card configuration 100 based on the memory module 90 of FIG. 4a. In one example of this embodiment, multi-card configuration 100 includes two memory modules 102a and 102b, each with 32 memory devices 48a located on each top surface and 32 memory devices 48b on each bottom surface of substrates 42. Each memory device 48a–48b has a bus width of 8 bits, thereby allowing each memory module 102a and 102b to have a memory data bus width of 512 bits. As stated hereinabove, approximately 1200 I/O are required to support a 512-bit data bus and are shown in I/O area 104a. The memory devices 48a–48b on memory module 102b use only one half of total I/O area 104. Memory module 102b allows enough I/O to pass through I/O area 104b to support another 512-bit data bus on a second memory module 102a thereby providing multi-card configuration 100 with an overall memory data bus 1024 bits wide. The electrical connection through I/O area 104b is provided in this example by a plurality of vias 108.

As stated hereinabove, a significant advantage of the present embodiment is derived from the clustering of the upper contact pad arrays 52a and mating lower contact pad arrays 54a, which are interconnected by area array interconnections 53a. Specific implementation of area array interconnections 53a for interconnecting contact pad arrays 52a and mating pad arrays 54a is design dependent and may vary depending on a specific set of requirements. In this example, due to the high quantity (approximately 2400) and density of I/O area 104, an LGA connector is the only known option that will provide reliable interconnections.

Lower contact pad arrays 54a on the lower module 102b are provided to allow electrical interconnection to a memory controller 14 on system board 12 through area array interconnections 53a. Upper contact pad arrays 52a on the lower module 102b mate with lower contact pad arrays 54a on the upper module 102a through area array interconnections 53a to extend the address and control buses from the memory controller 14. Maintaining uniform footprints for the interconnection between memory modules as well as to system board 12 reduces the proliferation of different memory module 90 (FIG. 4a) part numbers, and minimizes reliability and qualification testing. The substrates 42 may be designed so that the modules 102a and 102b are positionally independent within the stack by rotating one of the two modules 102a or 102b 180 degrees.

Spacer 106 may be implemented just as are area array interconnections 53a (i.e., an LGA connector). To reduce cost, spacer 106 may be implemented as a block of dielectric material that has approximately the same vertical dimension as interconnection 53a when compressed, since only half of the area array interconnections 53a must reach upper module 102a.

Since other modifications and changes varied to fit particular operating requirements and environments will be apparent to those skilled in the art, this invention is not considered limited to the example chosen for purposes of this disclosure, and covers all changes and modifications which does not constitute departures from the true spirit and scope of this invention.

Having thus described the invention, what is desired to be protected by Letters Patent is presented in the subsequently appended claims.

What is claimed is:

1. A stackable memory module with variable bandwidth comprising:
   a) a substrate having a first surface and a second surface;
   b) a first plurality of arrays of contact pads, at least two of said arrays being spaced apart from one another and disposed on said first substrate surface, said first plurality of arrays of contact pads being adapted to connect to and form an extension of an external memory bus having a plurality of memory channels;
   c) a plurality of memory devices mounted on said substrate and being selectively connectable to said plurality of memory channel of said memory bus extension; and
   d) a configuration device located on said memory module to store information thereof;
   wherein at least one of said memory devices is located on said first or second substrate surfaces between two of said first plurality of arrays of contact pads.

2. The stackable memory module as recited in claim 1, further comprising a register device located on one of said substrate surfaces.

3. The stackable memory module as recited in claim 1, further comprising a phase lock loop (PLL) device located on one of said substrate surfaces.

4. The stackable memory module as recited in claim 1, further comprising a plurality of capacitors located on at least one of said substrate surfaces.

5. The stackable memory module as recited in claim 1, further comprising a plurality of resistors located on at least one of said substrate surfaces.

6. The stackable memory module as recited in claim 1, wherein further comprising a register device located on one of said substrate surfaces.

7. The stackable memory module as recited in claim 1, further comprising at least one electrical component located on one of said substrate surfaces, said component being selected from the group of: decoder, field programmable device, clock synthesizer, skew control block, FIFO, thermal shutdown device, and thermal monitoring device.

8. The stackable memory module as recited in claim 1, wherein said substrate comprises a multi-layer printed circuit card.

9. The stackable memory module as recited in claim 1, wherein said substrate comprises at least one insulative material.

10. The stackable memory module as recited in claim 1, wherein at least one of said plurality of memory devices comprises at least one from the group of: bare chip, thin small outline package (TSOP), chip scale package (CSP) and chip on board (COB).

11. The stackable memory module as recited in claim 1, further comprising a thermal management structure.

12. The stackable memory module as recited in claim 11, wherein said thermal management structure comprises heat-conductive fins in thermal contact with at least one of said plurality of memory devices.

13. The stackable memory module as recited in claim 1, wherein said memory devices comprise SDRAM devices.

14. The stackable memory module as recited in claim 1, wherein said memory devices comprise DDR SDRAM devices.

15. The stackable memory module as recited in claim 1, wherein said plurality of memory channels are accessible as a single memory channel with a bandwidth greater than or equal to the bandwidth of any one of said plurality of memory channels.

16. The stackable memory module as recited in claim 1, wherein at least two of said plurality of memory devices may be accessed in parallel.

17. The stackable memory module as recited in claim 1, further comprising a microprocessor.

18. The stackable memory module as recited in claim 1, wherein said first plurality of arrays of contact pads is connected to said external memory bus through interconnection means.

19. The stackable memory module as recited in claim 18, wherein said interconnection means comprises a land grid array connector.

20. The stackable memory module as recited in claim 18, wherein said interconnection means comprises ball grid array interconnections.

21. The stackable memory module as recited in claim 1, wherein said external memory bus comprises a characteristic impedance.

22. The stackable memory module as recited in claim 21, further comprising a second plurality of arrays of contact pads spaced apart and disposed on said second surface, said second plurality of arrays of contact pads being adapted to connect to and form an extension of said external memory bus and to facilitate the interconnection to a plurality of arrays of contact pads spaced apart and disposed on a second module.

23. The stackable memory module as recited in claim 22, wherein said substrate comprises wiring means connecting at least one of said first plurality of arrays of contact pads on said first surface to at least one said second plurality of arrays of contact pads on said second surface.

24. The stackable memory module as recited in claim 22, wherein said second module comprises a second stackable memory module.

25. The stackable memory module as recited in claim 22, wherein said second module comprises a termination module.

26. The stackable memory module as recited in claim 21, further comprising bus termination means for operative connection to said memory bus extension, said bus termination means having an impedance substantially matching said characteristic impedance.

27. The stackable memory module as recited in claim 26, wherein said bus termination means comprises at least one electrical component from the group: resistors, capacitors and inductors.

28. The stackable memory module as recited in claim 27, wherein said resistors comprise discrete resistors.

29. The stackable memory module as recited in claim 27, wherein said resistors comprise a resistor pack.

30. A stackable module with variable bandwidth comprising:
   a) a substrate having a first surface and a second surface;
   b) a first array of contact pads disposed on said first substrate surface, said first array of contact pads being adapted to form an extension of an external data bus;
   c) a second array of contact pads disposed on said second substrate surface, at least one contact pad of said first array being operatively connected to at least one contact pad of said second array, thereby allowing a portion of said extension of an external data bus to pass through said stackable module for connection to a second stackable module;
   d) a plurality of semiconductor devices mounted on said substrate and being selectively connectable to said data bus extension; and
   e) a configuration device located on said memory module to store information thereof.

31. The stackable module as recited in claim 30, wherein said external bus comprises a characteristic impedance.

32. The stackable module as recited in claim 30, wherein said substrate comprises a multi-layer printed circuit card.

33. The stackable module as recited in claim 30, wherein said substrate comprises at least one insulative material.

34. The stackable module as recited in claim 30, wherein at least one of said plurality of semiconductor devices comprises at least one from the group of: bare chip, thin small outline package (TSOP), chip scale package (CSP) and chip on board (COB).

35. The stackable module as recited in claim 30, wherein said at least one of said semiconductor devices comprises a memory device.

36. The stackable module as recited in claim 30, further comprising a microprocessor.

37. The stackable module as recited in claim 30, further comprising interconnection means and wherein said first array of contact pads is connected to said external data bus through said interconnection means.

38. The stackable module as recited in claim 37, wherein said interconnection means comprises a land grid array connector.

* * * * *